United States Patent
Cox et al.

(10) Patent No.: US 9,773,692 B2
(45) Date of Patent: *Sep. 26, 2017

(54) IN-SITU REMOVABLE ELECTROSTATIC CHUCK

(71) Applicant: Applied Materials, Inc., Santa Clara, CA (US)

(72) Inventors: Michael S. Cox, Gilroy, CA (US); Lara Hawrylchak, Gilroy, CA (US); Steven V. Sansoni, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/353,499

(22) Filed: Nov. 16, 2016

(65) Prior Publication Data

US 2017/0062260 A1  Mar. 2, 2017

Related U.S. Application Data

(63) Continuation of application No. 14/451,139, filed on Aug. 4, 2014, now Pat. No. 9,508,584.

(60) Provisional application No. 61/862,462, filed on Aug. 5, 2013.

(51) Int. Cl.
*H01T 23/00* (2006.01)
*H01L 21/683* (2006.01)

(52) U.S. Cl.
CPC ..... *H01L 21/6833* (2013.01); *Y10T 29/49815* (2015.01)

(58) Field of Classification Search
CPC .................................................. H01L 21/6833
USPC ......................................................... 361/234
See application file for complete search history.

(56) References Cited

U.S. PATENT DOCUMENTS

| | | |
|---|---|---|
| 5,092,729 A | 3/1992 | Yamazaki et al. |
| 5,740,009 A | 4/1998 | Pu et al. |
| 5,789,843 A | 8/1998 | Higuchi et al. |
| 6,297,165 B1 | 10/2001 | Okumura et al. |
| 6,678,143 B2 | 1/2004 | Masuda et al. |
| 6,768,627 B1 | 7/2004 | Kitabayashi et al. |

(Continued)

FOREIGN PATENT DOCUMENTS

| | | |
|---|---|---|
| JP | H04237148 A | 8/1992 |
| JP | H09-162272 A | 6/1997 |

(Continued)

OTHER PUBLICATIONS

International Search Report and Written Opinion for International Application No. PCT/US2014/047656 dated Nov. 7, 2014.

(Continued)

*Primary Examiner* — Stephen W Jackson
(74) *Attorney, Agent, or Firm* — Patterson + Sheridan LLP

(57) ABSTRACT

Embodiments described herein generally relate to an electrostatic chuck (ESC). The ESC may contain a first plurality of electrodes adapted to electrostatically couple a substrate to the ESC and a second plurality of electrodes adapted to electrostatically couple the ESC to a substrate support. Instead of being integrally disposed within the substrate support, the ESC may be easily removed from the substrate support and removed from a chamber for maintenance or replacement purposes.

20 Claims, 5 Drawing Sheets

(56) References Cited

U.S. PATENT DOCUMENTS

| | | |
|---|---|---|
| 6,781,812 B2 | 8/2004 | Fuwa et al. |
| 7,804,675 B2 | 9/2010 | Poh |
| 7,881,036 B2 | 2/2011 | Fujisawa et al. |
| 7,916,447 B2 | 3/2011 | Kobayashi et al. |
| 8,125,756 B2 | 2/2012 | Poh |
| 8,238,072 B2 | 8/2012 | Fujisawa et al. |
| 8,325,457 B2 | 12/2012 | Park et al. |
| 8,335,070 B2 | 12/2012 | Poh |
| 8,503,156 B2 | 8/2013 | Ray et al. |
| 8,730,644 B2 | 5/2014 | Fujisawa et al. |
| 9,287,806 B2 | 3/2016 | Park |
| 9,508,584 B2 * | 11/2016 | Cox ................ H01L 21/6833 |
| 2004/0120095 A1 | 6/2004 | Yanagida |
| 2005/0016685 A1 | 1/2005 | Emoto et al. |
| 2008/0062609 A1 | 3/2008 | Himori et al. |
| 2012/0227886 A1 | 9/2012 | Hsiao et al. |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| JP | 2002-357838 A | 12/2002 |
| JP | 2003-179128 A | 6/2003 |
| JP | 2003-188240 A | 7/2003 |
| JP | 2003-243493 A | 8/2003 |
| JP | 2003-282692 A | 10/2003 |
| JP | 2005-109358 A | 4/2005 |
| KR | 10-2007-0016227 A | 2/2007 |
| KR | 10-2008-0089463 A | 10/2008 |

OTHER PUBLICATIONS

Office Action for U.S. Appl. No. 14/451,139 dated Apr. 21, 2016.
Office Action for Korean Application No. 10-2016-7005800 dated Jul. 27, 2017.

\* cited by examiner

IN-SITU REMOVABLE ELECTROSTATIC CHUCK

CROSS-REFERENCE TO RELATED APPLICATIONS

This application is a continuation of U.S. patent application Ser. No. 14/451,139, filed Aug. 4, 2014, which claims benefit of U.S. Provisional Patent Application No. 61/862,462, filed Aug. 5, 2013, both of which are hereby incorporated by reference in their entirety.

BACKGROUND

Field

Embodiments described herein generally relate to an electrostatic chuck (ESC). More specifically, embodiments described herein relate to an in-situ removable electrostatic chuck surface.

Description of the Related Art

In the processing of substrates, such as semiconducting substrates and displays, the substrate is held on a support in a process chamber during processing. The support can include an ESC that has an electrode capable of being electrically biased to hold the substrate on the support. The support can comprise a pedestal that supports the ESC in the chamber, and may be capable of raising or lowering the height of the ESC and substrate. The pedestal can also provide a protective enclosure for connecting wires, gas tubes, etc., that connect to portions of the support.

In some plasma processes used to process the substrate, energized gases are used to process the substrate by, for example, etching or depositing material on the substrate, or to clean surfaces in the chamber. These energized gases can comprise highly corrosive species, such as chemical etchants, as well as energized ionic and radical species that can erode portions of the ESC. The eroded ESC can be problematic because the damaged ESC may not provide the desired electrical characteristics for processing substrate or holding substrates. Also, particles that have eroded from the ESC can contaminate substrates being processes within the chamber.

Thus, the ESC's will eventually require replacement or refurbishment when they have eroded or have accumulated process deposits that require extensive cleaning after exposure to multiple plasma processing cycles. Replacement of the ESC typically requires the chamber to be opened to atmosphere. Once the ESC has been replaced, the entire chamber must be carefully wiped down and cleaned prior to a lengthy pump down process. Accordingly, replacing an ESC is a time consuming and expensive process.

Thus, it is desirable to have an ESC that has a reduced impact on productivity when replacement is required.

SUMMARY

In one embodiment, an electrostatic chuck is provided. The electrostatic chuck includes a substantially rigid support layer having a bottom surface defining a bottom of the electrostatic chuck, a top surface, a first electrode, and a second electrode at least partially interleaved with the first electrode. A dielectric layer has a top surface defining a top of the electrostatic chuck and the first and second electrodes may be disposed between the top surface of the dielectric layer and the top surface of the support layer. The support layer, electrodes, and dielectric layer may form a unitary body. A first connector may be coupled to the first electrode and may be exposed to the bottom of the electrostatic chuck. A second connector may be coupled to the second electrode and may be exposed to the bottom of the electrostatic chuck. The first and second connectors may be configured to make electrical connection with a power source via a contact with a spring loaded conductor.

In another embodiment, an apparatus for chucking a substrate is provided. The apparatus includes a support member which includes a top surface, a first plurality of lift pins disposed through holed formed through the top surface, and a second plurality of lift pins disposed through holed formed through the top surface. The apparatus also includes an electrostatic chuck disposed on the top surface of the support member. The electrostatic chuck includes a substantially rigid support layer having a bottom surface defining a bottom of the electrostatic chuck and a top surface. A first electrode may be at least partially interleaved with a second electrode. A dielectric layer may have a top surface defining a top of the electrostatic chuck and the first and second electrodes may be disposed between the top surface of the dielectric layer and the top surface of the support layer. The apparatus further includes a first actuator configured to displace the first plurality of lift pins between an elevated position projecting through the top surface of the dielectric layer and a retracted position flush with or below the top surface of the dielectric layer. The apparatus further includes a second actuator configured to displace the second plurality of lift pins between an elevated position spacing the electrostatic chuck from the top surface of the support member and a retracted position seating the electrostatic chuck on the top surface of the support member.

In yet another embodiment, a method of replacing an electrostatic chuck within a processing chamber is provided. The method includes actuating a first set of lift pins to space a first electrostatic chuck from a support member disposed in the processing chamber. The first electrostatic chuck may be robotically removed from the first set of lift pins and a second electrostatic chuck may be robotically placed on the first set of lift pins. The first set of lift pins may be actuated to set the second electrostatic chuck on the support member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to an electrostatic chuck (ESC) that is in-situ removable from a vacuum processing chamber. That is, the ESC may be replaced from the processing chamber without removing breaking vacuum. Thus, the ESC advantageously allows replacement with minimal interruption to substrate processing and eliminates expensive chamber cleaning, bake-outs, and pump downs typically associated with opening a processing chamber to facilitate replacement of conventional ESC's.

Figure 1:
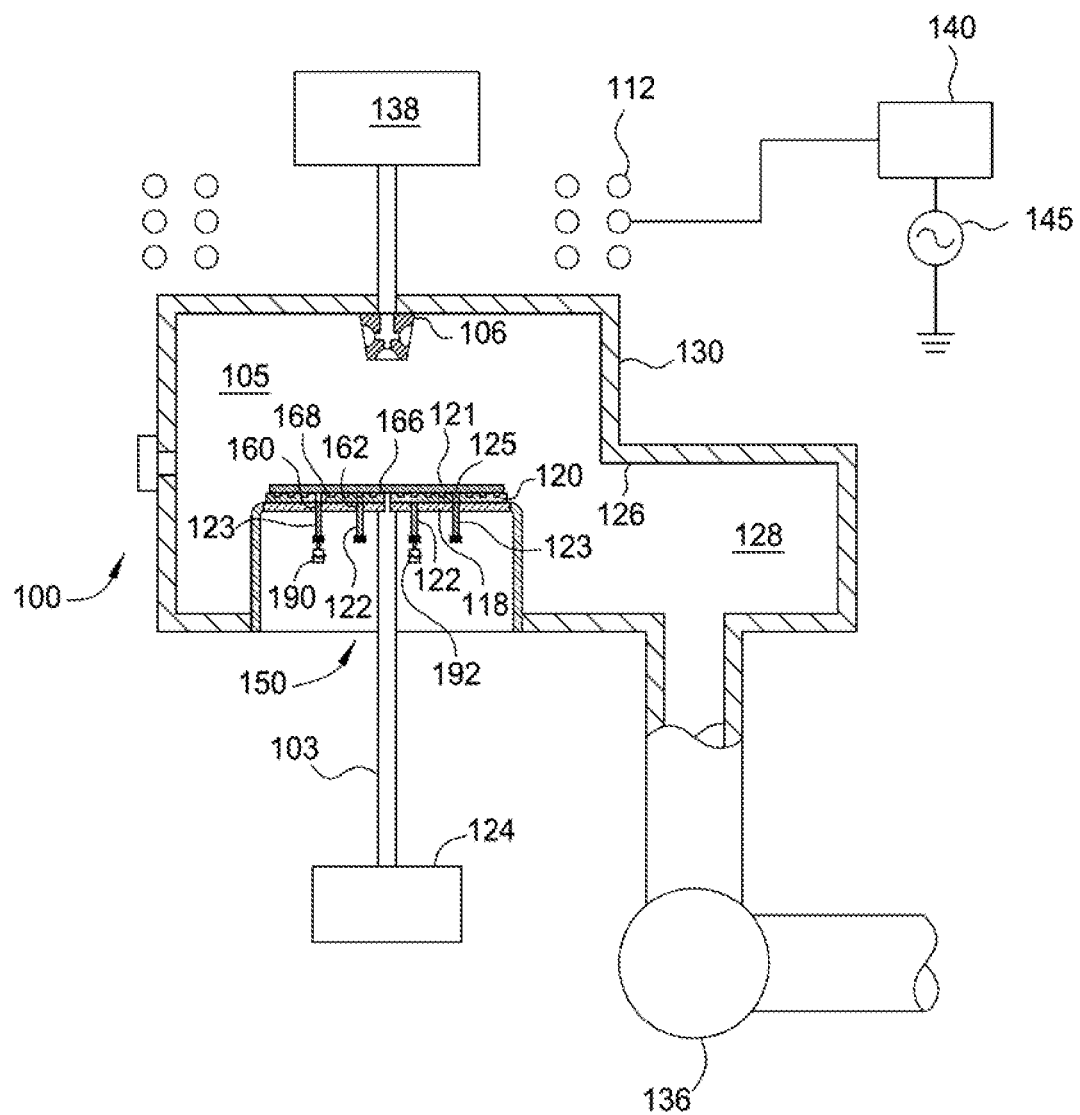
FIG. 1 is a schematic, cross-sectional view of a processing chamber having a substrate support.

FIG. 1 is a schematic, cross-sectional view of a vacuum processing chamber 100 that includes one embodiment of a substrate support 150 and ESC 120. Although the processing chamber 100 is illustrated as an etching chamber, other types of processing chambers, such as deposition, ion implant, anneal, plasma treating, and others, may be adapted to utilized at least one of the substrate support and ESC described herein.

The processing chamber 100 generally includes walls 130, and a nozzle 106 which define a process volume 105. The process volume 105 may be accessed through a slit valve opening 108 such that a substrate 121 may be robotically transferred in and out of the chamber 100. An exhaust region 128 may comprise walls 126 and may be coupled to a vacuum pump 136 which may be adapted to exhaust processing gases from the process volume 105 through the exhaust region 128 and out of the chamber 100.

The substrate support 150 may be disposed within the chamber 100. The substrate support 150 may comprise a substrate support body 118 which may be disposed within the process volume 105. The support body 118 may be stationary as shown in FIG. 1, or may be coupled to an actuator to raise and lower the substrate support body 118. The support body 118 includes a first plurality of lift pin holes 160 and a second plurality of lift pin holes 162. The ESC 120 may be removably coupled to the support body 118. The ESC 120 is configured to retain a substrate 121 thereon during processing. The ESC 120 includes lift pins holes 125 that align with the first plurality of lift pin holes 160. The ESC 120 may be especially useful in the processing of thin substrates.

A first plurality of lift pins 123 may be moveably disposed through the holes 160, 125 of the support body 118 and ESC 120. The first plurality of lift pins 123 are interfaced in a first actuator 190 which displaces the lift pins 123 through the support body 118 and ESC 120 between a first or lowered position that is flush with or below a substrate support surface 166 of the ESC 120 and a second or elevated position that is extended above the support surface 166. In the first position, the substrate 121 is seated on the support surface 166. In the second position, the substrate 121 is spaced above the support surface 166 to allow robotic transfer of the substrate into and out of the processing chamber 100. It is contemplated that in addition to using lift pins, a plurality of discrete fingers or a hoop apparatus may be utilized to transfer the substrate into and out of the processing chamber 100.

The second plurality of lift pins 122 are disposed through the second lift pin holes formed through the support body 118. The second plurality of lift pins 122 are interfaced in a second actuator 192 which displaces the lift pins 122 through the support body 118 between a first or lowered position that is flush with or below an upper surface 168 of the support body 118 and a second or elevated position that is extended above the upper surface 168. In the first position, the ESC 120 is seated on the upper surface 168 of the support body 118. In the second position, the ESC 120 is spaced above the support surface 168 to allow robotic transfer of the ESC 120 into and out of the processing chamber 100 without having to open the processing chamber 100 to atmosphere. Similar to transfer of the substrate above, it is contemplated that transfer of the ESC 120 may be performed by a plurality of discrete fingers or a hoop apparatus.

In relation to the removable ESC 120, the support body 118 may include a gas conduit 103 and electrical conduits (not shown in FIG. 1) which will be described in greater detail with regard to FIG. 2 for providing power and backside gas to the ESC 120. The support body 118 may also include heating and/or cooling elements (not shown) adapted to maintain the support body 118 at a desired temperature. The heating and/or cooling elements may be resistive heaters, fluid conduits and the like.

The processing chamber 100 also includes a gas delivery apparatus for providing process and/or cleaning gases to the processing chamber 100. In the embodiment depicted in FIG. 1, the gas delivery apparatus is in the form of at least one nozzle 106 formed through the chamber walls 130. A gas panel 138 may be coupled to the nozzle 106 formed through the walls 130 to provide process gases to the process volume 105 through gas passages formed through the nozzle 106. The gas panel 138 may include a silicon-containing gas supply source, an oxygen containing gas supply source, and a nitrogen-containing gas supply source, or other gases suitable for processing the substrate within the chamber 100.

A plasma generator may also be coupled to the chamber 100. The plasma generator may comprise a signal generator 145 coupled to an electrode or antenna. The signal generator 145 generally provides energy at a frequency suitable to form and/or maintain a plasma in the chamber 100. For example, the signal generator 145 may provide a signal at a frequency of about 50 kHz to about 2.45 GHz. The signal generator 145 may be coupled to the electrode through a matching network 140 to minimize reflected power during use. The RF power may be applied through the electrodes in the ESC 120 being mixed with a chucking DC voltage externally to the ESC 120. The RF power may also be capacitively coupled from the support body 118 through the ESC 120 to the substrate 121.

The electrode may be an antenna comprising at least one RF coil 112. The RF coil 112 may be disposed above the chamber 100 and may be configured to inductively coupled RF energy to the process gas provided to the process volume 105 through the nozzle 106 from the gas panel 138.

Figure 2:
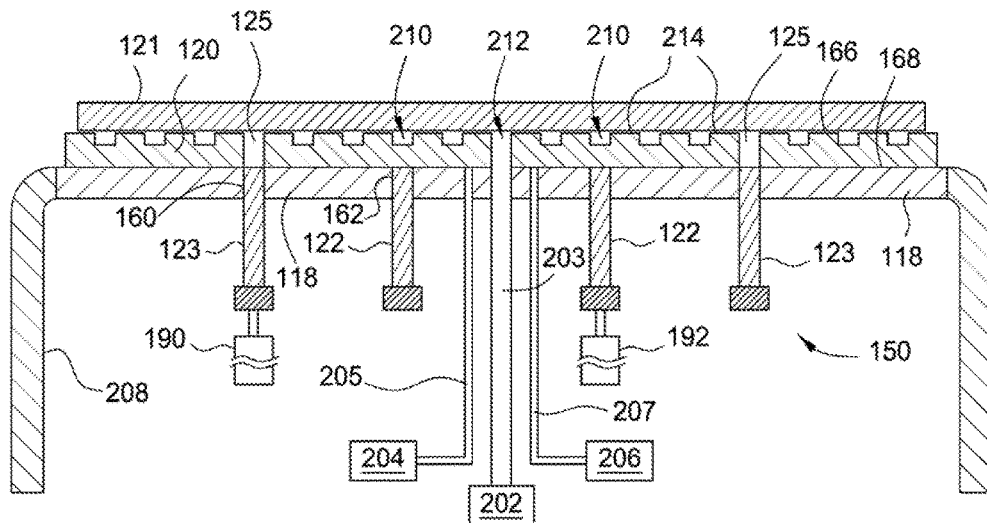
FIG. 2 is a schematic, cross-sectional view of the substrate support depicted in FIG. 1 illustrating a substrate seated on an ESC of the substrate support.

FIG. 2 is a schematic, cross-sectional view of the substrate support 150 depicted in FIG. 1. The support body 118 may further comprise a base 208 which may house various conduits or leads utilized to provide power, gas or sensing to the ESC 120. For example, a first electrical lead 205 may be coupled to a first power source 204 and may extend through the base 208 to the ESC 120. A second electrical lead 207 may be coupled to a second power source 206 and may also extend through the base 208 to the ESC 120. The first electrical lead 205 and the second electrical lead 207 terminate within the support body 118 at one or more coupling mechanisms which are configured to provide electrical connection with the ESC 120 when the ESC 120 is seated on the support body 118. A gas conduit 203 may be coupled to a gas source 202 and may extend through the base 208 to an outlet 212 which may formed on the support surface 266 of the ESC 120. The gas source 202 may be adapted to provide a backside heat transfer gas, such as helium, hydrogen, nitrogen, argon, or other inert gases, to a region between the ESC 120 and the substrate 121. The gases may be adapted to facilitate heat transfer between the substrate 121 and the ESC 120. Details regarding the ESC 120 and how it is coupled to the support body 118 will be described in more detail with regard to FIG. 5.

As discussed above, the ESC 120 is removably connected to the support body 118. The ESC 120 may be secured to the support body 118 via clamps, screws, vacuum or other suitable methods. In the embodiment depicted in FIG. 2, the ESC 120 is electrostatically coupled to the support body 118.

The support surface 166 of the ESC 120 may additionally comprise one or more gas channels 210. The gas channels 210 may be formed on the surface of the ESC 120 which may contact the substrate 121. The one or more gas channels 210 may be arranged in various orientations, such as a single concentric circular pattern, a radial pattern, or a linear grid pattern. Gas provided from the gas source 202 through the gas conduit 203 to the outlet 212 may disperse through the one or more gas channels 210 to facilitate heat transfer between the substrate 121 and the ESC 120. It is contemplated that a depth of the one or more gas channels 210 may be adapted to facilitate heat transfer by conduction. As such, the depth may be shallow enough to allow atoms of the gas to travel between the substrate 121 and the ESC 120 in order to facilitate heat transfer by thermal conduction. One or more dividers 214, such as posts or ridges, may separate and define the one or more gas channels 210. The dividers 214 may contact the substrate 121 and may extend from the one or more gas channels 210 several microns, such as between about 1 $\mu$m and about 10 $\mu$m, for example, between about 2 $\mu$m and about 5 $\mu$m.

As depicted in FIG. 2, the ESC 120 may be electrostatically coupled to the substrate support body 118, and the substrate 121 may be electrostatically coupled to the ESC 120. The ESC 120 may comprise one or more separate electrode assemblies, the details of which will be discussed in detail with regard to FIG. 5. In embodiments where a first electrode assembly is utilized to couple the ESC 120 to the support body 118 and a second electrode assembly is utilized to secure the substrate 121 to the ESC 120, a first power source 204 may be coupled to the first electrode assembly via a first electrical lead 205 while a second power source 206 may be coupled to the second electrode assembly via a second electrical lead 207. In operation, the first power source 204 may provide an electrical signal which may chuck the ESC 120 to the substrate support body 118 and the second power source 206 may provide an electrical signal which may chuck the substrate 121 to the ESC 120. The substrate 121 and ESC 120 may remain chucked during processing operations performed on the substrate 121. To remove either the substrate 121 or the ESC 120, or both from the substrate support body 118, an electrical signal pulse having a polarity opposite of the signal used to chuck the substrate/ESC may be provided to allow the substrate 121 to be removed from the ESC 120 and the ESC 120 to be removed from the support body 118.

Figure 3:
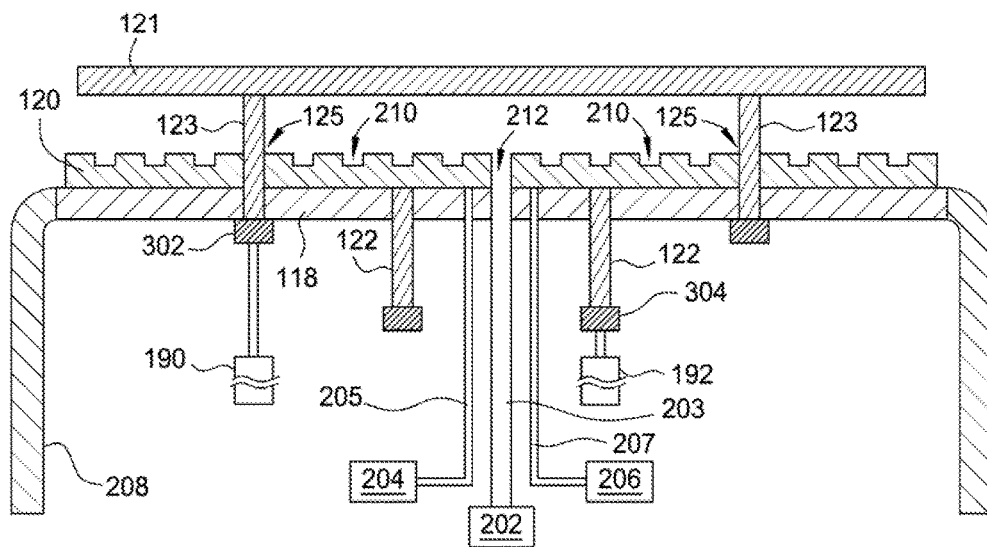
FIG. 3 is a schematic, cross-sectional view of the substrate support illustrating a substrate spaced above the ESC by lift pins.

FIG. 3 is a schematic, cross-sectional view of the substrate support 150 of FIG. 2 with the substrate 121 in an elevated position. Once the substrate 121 has been electrostatically decoupled from the ESC 120, the first actuator 190 is activated to raise a lift ring 302 contacting the distal ends of the second lift pins 123. As the lift ring 302 is elevated towards the support body 118, the lift pins 123 are displace upwards and projected through the support surface 166 until the substrate 121 is spaced above the support surface 166 a distance that allows for a robot blade (not shown) to pass between the substrate 121 and support surface 166 to facilitate robotic transfer of the substrate 121. The substrate 121 may be seated on the support surface 166 by actuating the first actuator 190 to cause the first lift ring 302 to move away from the support body 118, thereby allowing the lift pins 123 to return to a retracted position that lowers and seats the substrate 121 on the support surface 166, as shown in FIG. 2.

Once on the support surface 166, the substrate 121 may be secured to the substrate support 150 by providing an electrical signal from the second power source 206 to electrostatically couple the substrate 121 to the ESC 120.

Figure 4:
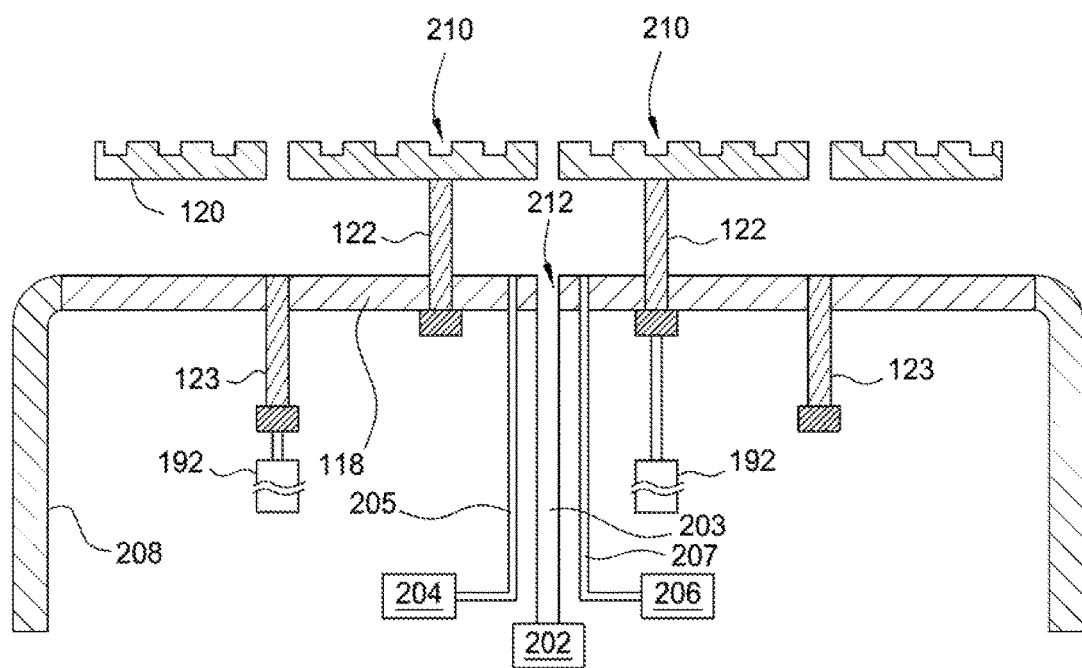
FIG. 4 is a schematic, cross-sectional view of the substrate support illustrating the ESC spaced above a body of the substrate support by lift pins.

FIG. 4 is a schematic, cross-sectional view of the substrate support 150 of FIG. 2 with the ESC 120 shown in an elevated position, spaced above the upper surface 168 of the support body 118. Once the ESC 120 is electrostatically decoupled, or otherwise unsecured, from the substrate support body 118, the second actuator 192 may be activated to displace a second lift ring 304 towards the support body 118. The second lift ring 304 contacts the distal ends of the second lift pins 122, causing the lift pins 122 to extend through the support body 118 and engage the ESC 120, thereby spacing the ESC 120 above the upper surface 168 of the support body 118 to allow space for a robot blade (not shown) to extend between the support body 118 and ESC 120 to facilitate robotic removal and replacement of the ESC 120 from the chamber 100 without breaking vacuum. Once a replacement ESC 120 has been placed on the second lift pins 122, the second actuator 192 may lower the lift ring 304, thus allowing the lift pins 122 to retract into the body 118 and seat the ESC 120 on the upper surface 168, as shown in FIG. 2. The ability to quickly and easily remove the ESC 120 from the chamber 100 without exposing the process volume 105 to atmosphere reduces the cost and time associated with traditional ESC maintenance procedures.

Once the ESC 120 is disposed on the upper surface 168 of the body 118, the ESC 120 may be coupled to the substrate support 150 in a suitable manner. For example, an electrical signal may be provided to the ESC 120 by the first power source 204 to electrostatically couple the ESC 120 to the upper surface 168 of the support body 118.

A single robot end effector (i.e., robot blade or gripper) may be utilized to remove both the substrate 121 and the ESC 120. In one example, the end effector may have a first region sized to engage the substrate 121 and a second region sized to engage the ESC 120. Another example, the substrate 121 and ESC 120 have similar diameters, thus allowing a single end effector to be utilized to transfer both the substrate 121 and the ESC 120.

Figure 5:
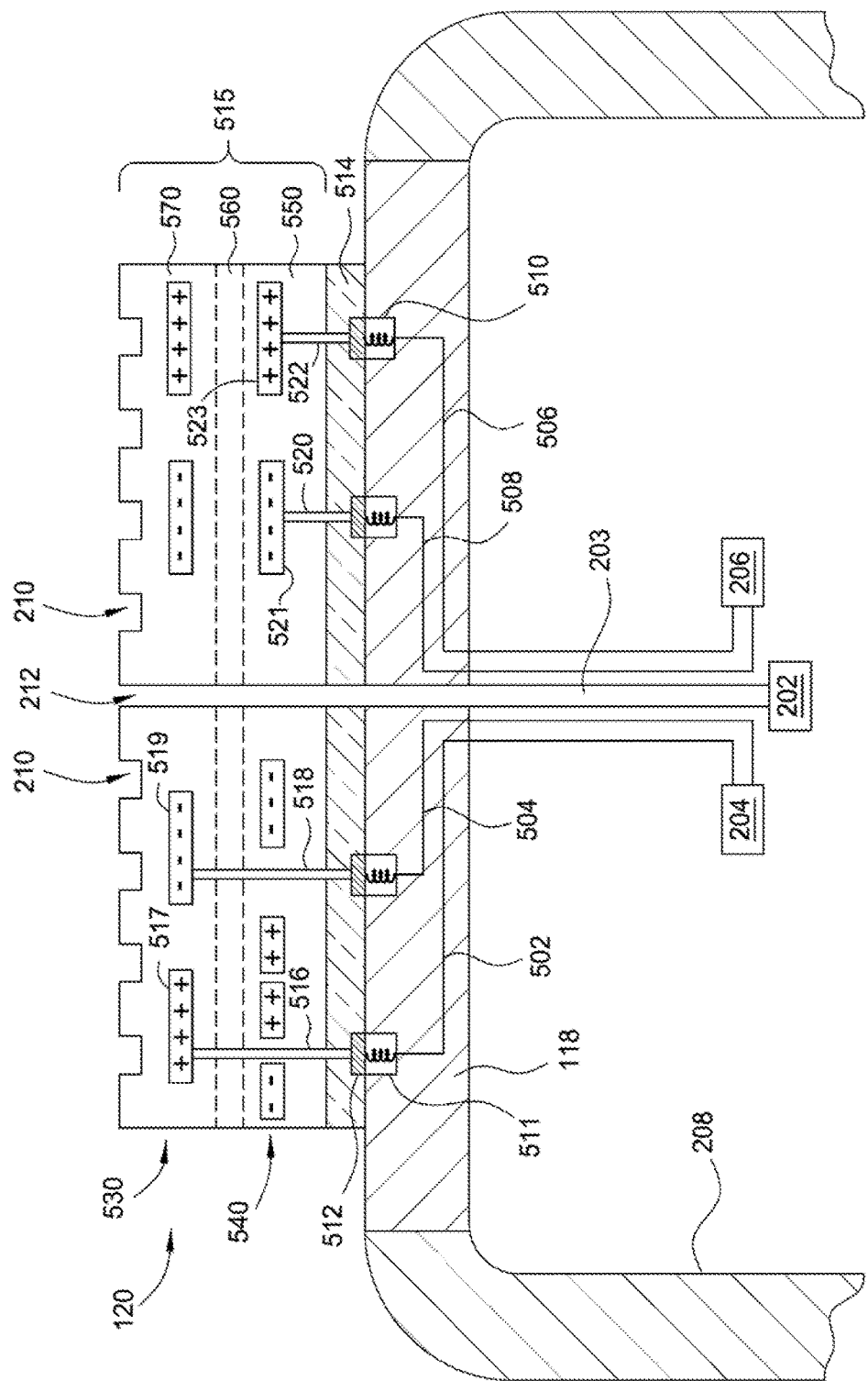
FIG. 5 is a detailed, cross-sectional view of one embodiment of an ESC to a substrate support.
Figure 6:
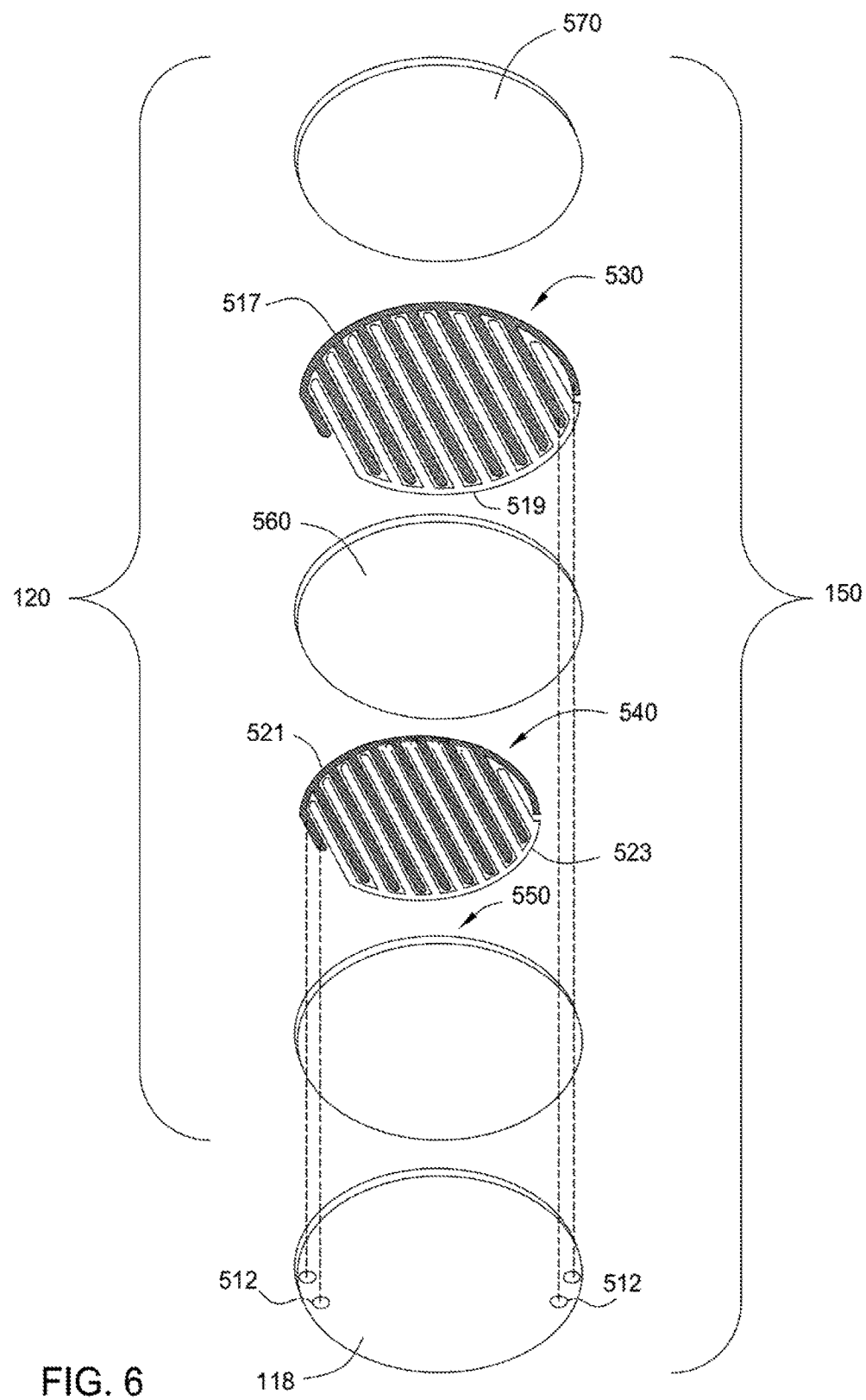
FIG. 6 is a simplified exploded view of the ESC illustrated in FIG. 5.

FIGS. 5 and 6 are detailed, cross-sectional and exploded views of one embodiment of the ESC 120 disposed on the support body 118. In FIG. 5, the lift pins and associated actuators have been omitted for clarity. The ESC 120 may comprise a support layer 514 and a dielectric layer 515. The support layer 514 may be formed from a material capable of supporting the dielectric layer 515 and having desirable thermal transfer properties, such as glass or a metallic material. The dielectric layer 515 may be formed from a dielectric material or a ceramic material such as aluminum nitride or aluminum oxide, or may be multiple layers of dielectric material laminated together. For example, a bottom dielectric layer 550, middle dielectric layer 560, and a top dielectric layer 570 may be laminated together to form the dielectric layer 515. Suitable examples of ceramic materials or dielectric materials include polymers (i.e. polyimide), sapphire, silicon oxide, such as quartz or glass, aluminum oxide, aluminum nitride, yttrium containing materials, yttrium oxide, yttrium-aluminum-garnet, titanium oxide, titanium nitride, silicon carbide, and the like. The materials selected for the support layer 514 and dielectric layer 515 may have similar coefficients of thermal expansion to reduce the mechanical stress between the layers when subjected to temperature cycling.

The ESC 120 includes at least one electrode assembly utilized to secure the substrate 121 to the ESC 120. The at least one electrode assembly may also be utilized to secure the ESC 120 to the upper surface 168 of the support body 118. Optionally, and as depicted in FIG. 1, different electrode assemblies may be utilized to secure the substrate 121 to the ESC 120 and the ESC 120 to the upper surface 168 of the support body 118. The electrode assemblies may be disposed between the support layer 514 and the dielectric layer 515, or be embedded within the dielectric layer 515

For example as shown in FIG. 5, the ESC 120 may include an upper electrode assembly 530 and a lower electrode assembly 540. The lower electrode assembly 540 may be disposed on the support layer 514, or be disposed in the dielectric layer 515, and is configured to secure, via electrostatic attraction, the ESC 120 to the support body 118. The upper electrode assembly 530 may be disposed within the top dielectric layer 570 and may be adapted to electrostatically couple a substrate 121 to the ESC 120.

The lower electrode assembly 540 may be disposed between a bottom dielectric layer 550 and a middle dielectric layer 560 of the dielectric layer 515. The middle dielectric layer 560 may be adapted to prevent charge leakage between the upper electrode assembly 530 and the lower electrode assembly 540. The upper electrode assembly 530 may be disposed between a top dielectric layer 570 and the middle dielectric layer 560 of the dielectric layer 515. The surface of the top dielectric layer 570 facing away from the middle dielectric layer 560 defines the support surface 166 upon which the substrate 121 resides during processing.

The upper electrode assembly 530 includes a plurality of distributed electrodes, shown as a first electrode 517 and a second electrode 519. The first electrode 517 is shown with a positive charge applied while the second electrode 519 is shown with a negative charge applied. Similarly, the lower electrode assembly 540 includes a plurality of distributed electrodes, shown as a third electrode 523 having a positive charge applied and a fourth electrode 521 having a negative charge applied.

The upper electrode assembly 530 may be electrically coupled to the first power source 204 through vias 516, 518, one or more connectors 512, one or more conductors 510, and leads 502, 504. A first via 516 may be coupled to the one or more first electrodes 517 may extend through the dielectric layer 515 and the support layer 514 to the connector 512. The one or more first electrodes 517 may be fabricated from a metallic material having a coefficient of thermal expansion similar to the adjacent dielectric material 515. The first via 516 may be fabricated from an electrically conductive material, such as copper or aluminum. The connector 512 may be formed in the support layer 514 and may also be fabricated from an electrically conductive material, such as copper or aluminum. As shown, the connector 512 is in contact with the conductor 510. When the ESC 120 is lifted from the support body 118, the conductor 510 may extend slightly beyond the top surface of the support body 118. The conductor 510, such as a spring, may be fabricated from an electrically conductive material, such as copper or aluminum. The conductor 510 may be coupled to the substrate support body 118, such as by soldering or other suitable connection, and a first lead 502 may be electrically coupled to the conductor 510. The first lead 502 may extend through the support body 118 and the base 208 to the first power source 204. The first lead 502 may also be fabricated from an electrically conductive material, such as copper or aluminum.

A second via 518 may be coupled to the second electrodes 519 may extend through the dielectric layer 515 and the support layer 514 to the connector 512. The conductor 510 may be electrically coupled to the connector 512 and to the support body 118. A second lead 504 may be coupled to the conductor 510 and may extend through the support body 118 and the base 208 to the first power source 204. The elements coupling the one or more second electrodes 519 and the first power source 204 may be fabricated from substantially the same materials as referenced above.

In operation, a positive charge may be applied to the one or more first electrodes 517 and a negative charge may be applied to the one or more second electrodes 519 of the upper electrode assembly 530 to generate an electrostatic force when power is provided from the first power source 204. During chucking, the electrostatic force generated from the upper electrodes 517, 519 chucks and holds a substrate disposed thereon in a secured position. As the power supplied from the first power source 204 is turned off, the charges generated in the upper electrodes 517, 519 are extinguished, releasing the substrate held on the ESC 120.

Similar to the upper electrode assembly 530, the lower electrode assembly 540 may be electrically coupled to the second power source 206 through vias 520, 522, the connectors 512, the conductors 510, and leads 506, 508. A third via 522 may be coupled to the one or more third electrodes 523 and extend through the dielectric layer 515 and the support layer 514 to the connector 512. The third via 522 may be fabricated from an electrically conductive material, such as copper or aluminum. The connector 512 may be formed in the support layer 514 and may also be fabricated from an electrically conductive material, such as copper or aluminum. As shown, the connector 512 is in contact with the conductor 510. When the ESC 120 is lifted from the support body 118, the conductor 510 may extend beyond the top surface of the support body 118. The conductor 510, such as a spring, may be fabricated from an electrically conductive material, such as copper or aluminum. The conductor 510 may be coupled to the support body 118, such as by soldering, and a third lead 506 may be electrically coupled to the conductor 510. The third lead 506 may extend through the support body 118 and the base 208 to the second power source 206. The third lead 506 may also be fabricated from an electrically conductive material, such as copper or aluminum.

A fourth via 520 may be coupled to the one or more fourth electrodes 521 may extend through the dielectric layer 515 and the support layer 514 to the connector 512. The conductor 510 may be electrically coupled to the connector 512 and to the support body 118. A fourth lead 508 may be coupled to the conductor 510 and may extend through the support body 118 and the base 208 to the second power source 206. The elements coupling the one or more fourth electrodes 521 and the second power source 206 may be fabricated from substantially the same materials as referenced above.

In operation, a positive charge may be applied to the one or more third electrodes 523 and a negative charge may be applied to the one or more fourth electrodes 521 of the lower electrode assembly 540 to generate an electrostatic force when power is provided from the second power source 206. During chucking, the electrostatic force generated from the lower electrodes 521, 523 chucks and holds the ESC 120 in a secured position on the support body 118. As the power supplied from the second power source 206 is turned off, the charges generated in the lower electrodes 521, 523 are extinguished, releasing the ESC 120 held on the support body 118. It is also contemplated that mechanical means may be utilized to clamp the ESC 120 to the support body 118. In this embodiment, the clamping means may provide an electrical path for the upper and/or lower electrodes which may eliminate the need for vias formed through the ESC 120.

The ESC 120 may require less material and fewer processing steps to manufacture than a conventional ESC. Thus, the cost of making and using the ESC may be greatly reduced. Additionally, the ease of removal of the ESC from the substrate support and the chamber may also reduce the cost of ownership. Corrective and preventative maintenance, and even replacement of the ESC, may be performed in a more efficient and cost effective manner.

While the foregoing is directed to embodiments of the present disclosure, other and further embodiments of the disclosure may be devised without departing from the basic scope thereof, and the scope thereof is determined by the claims that follow.

The invention claimed is:

1. An electrostatic chuck, comprising:
   a support layer having a bottom surface defining a bottom of the electrostatic chuck and a top surface;
   a dielectric layer having a coefficient of thermal expansion about equal to a coefficient of thermal expansion of the support layer, the dielectric layer disposed on the top surface of the support layer, wherein the dielectric layer has a top surface defining a top of the electrostatic chuck;
   a first electrode disposed in the dielectric layer;
   a second electrode disposed in the dielectric layer and interleaved with the first electrode; and
   a plurality of connectors coupled to the first electrode and the second electrode through the bottom of the electrostatic chuck.

2. The electrostatic chuck of claim 1, wherein the first connector comprises a conductive pad.

3. The electrostatic chuck of claim 1 further comprising:
   one or more conductive vias electrically connecting the pad to the first electrode through the support layer.

4. The electrostatic chuck of claim 1, wherein the support layer comprises a glass or ceramic material.

5. The electrostatic chuck of claim 1, wherein the dielectric layer comprises a glass or ceramic material.

6. The electrostatic chuck of claim 1, wherein the plurality of connectors are configured to contact a plurality of spring loaded conductors.

7. The electrostatic chuck of claim 1, wherein the first electrode comprises a plurality of fingers interleaving with a plurality of fingers of the second electrode.

8. The electrostatic chuck of claim 1, wherein the support layer and the dielectric layer have a gas conduit formed therein and a plurality of lift pin holes formed therethrough.

9. The electrostatic chuck of claim 8, wherein the top surface of the dielectric layer has one or more gas channels formed therein, the gas channels coupled to the gas conduit.

10. An apparatus for chucking a substrate, comprising:
    a base member comprising a plurality of lift pins, the base member having a top surface;
    an electrostatic chuck disposed on the top surface of the base member, the electrostatic chuck comprising:
      a support layer having a bottom surface defining a bottom of the electrostatic chuck and a top surface;
      a dielectric layer disposed on the top surface of the support layer, the dielectric layer having a top surface defining a top of the electrostatic chuck;
      a first electrode disposed in the dielectric layer between the top surface of the dielectric layer and the top surface of the support layer;
      a second electrode disposed in the dielectric layer and interleaved with the first electrode; and
    a plurality of actuators configured to displace the plurality of lift pins between an elevated position and a retracted position.

11. The apparatus of claim 10, wherein the top surface of the base member comprises:
    a recess for receiving the electrostatic chuck.

12. The apparatus of claim 11, wherein the electrostatic chuck further comprises:
    one or more gas delivery grooves formed in an outer edge of the electrostatic chuck and coupled to one more gas delivery grooves formed in the top surface of the electrostatic chuck, the gas delivery grooves formed in the outer edge of the electrostatic chuck bounded by a sidewall of the recess formed in the top surface of the base member.

13. The apparatus of claim 10, wherein a plurality of connectors are coupled to the first electrode and the second electrode through the bottom of the electrostatic chuck.

14. The apparatus of claim 13, wherein the plurality of connectors are configured to contact a plurality of spring loaded conductors.

15. The apparatus of claim 10, wherein the electrostatic chuck and the base member have electrical connections configured to automatically engage and disengage in response to the position of the electrostatic chuck relative to the base member.

16. The apparatus of claim 10, wherein the support layer and the dielectric layer comprise a glass or ceramic material.

17. The apparatus of claim 10, wherein the dielectric layer comprises a coefficient of thermal expansion about equal to a coefficient of thermal expansion of the support layer.

18. The apparatus of claim 10, wherein the first electrode comprises a plurality of fingers interleaving with a plurality of fingers of the second electrode.

19. A method of replacing an electrostatic chuck within a processing chamber, comprising:
    elevating a first plurality of lift pins to space a first electrostatic chuck from a support member;
    removing the first electrostatic chuck from the first plurality of lift pins;
    positioning a second electrostatic chuck on the first plurality of lift pins; and
    actuating the first plurality of lift pins to set the second electrostatic chuck on the support member.

20. The method of claim 19, wherein positioning the second electrostatic chuck on the first plurality of lift pins comprises:
    aligning holes formed through the second electrostatic chuck with a second plurality of lift pins.

* * * * *